(12) United States Patent
Yune et al.

(10) Patent No.: US 12,249,994 B2
(45) Date of Patent: Mar. 11, 2025

(54) METHOD FOR MEASURING STATES OF TIME-BIN QUBITS IN A QUANTUM CRYPTOGRAPHY KEY DISTRIBUTION SYSTEM USING A TIME-TO-DIGITAL CONVERTER AND A SYSTEM FOR THE SAME

(71) Applicant: SDT Inc., Seoul (KR)

(72) Inventors: Jiwon Yune, Gwacheon-si (KR); Byungkwon Park, Suwon-si (KR)

(73) Assignee: SDT INC., Seoul (KR)

( * ) Notice: Subject to any disclaimer, the term of this patent is extended or adjusted under 35 U.S.C. 154(b) by 0 days.

(21) Appl. No.: 18/767,308

(22) Filed: Jul. 9, 2024

(65) Prior Publication Data

US 2025/0023556 A1 Jan. 16, 2025

(30) Foreign Application Priority Data

Jul. 11, 2023 (KR) .................. 10-2023-0089585
Aug. 28, 2023 (KR) .................. 10-2023-0112832

(51) Int. Cl.
*H03K 5/133* (2014.01)
*H03K 5/135* (2006.01)
*H03M 7/16* (2006.01)

(52) U.S. Cl.
CPC ............ *H03K 5/133* (2013.01); *H03K 5/135* (2013.01); *H03M 7/165* (2013.01)

(58) Field of Classification Search
None
See application file for complete search history.

(56) References Cited

U.S. PATENT DOCUMENTS 9,794,065 B2 * 10/2017 Wabnig et al. ....... H04L 9/0858
2023/0206105 A1 6/2023 Spiropulu et al.

OTHER PUBLICATIONS

Korean Office Action for Application No. 10-2023-0112832, dated Nov. 15, 2023, with English translation.
Nock et al., "Improved FPGA time-to-digital converter architecture to improve precision, converter linearity and reduce dead-time," Proc. SPIE 11386, Advanced Photon Counting Techniques XIV, 1138605, May 26, 2020.
Shaw et al., "Optimal temporal filtering for COW-QKD," 2022 IEEE International Conference on Signal Processing and Communications (SPCOM), Bangalore, India, 2022, pp. 1-4, dated Aug. 1, 2022.

* cited by examiner

*Primary Examiner* — Cassandra F Cox
(74) *Attorney, Agent, or Firm* — Birch, Stewart, Kolasch & Birch, LLP

(57) ABSTRACT

Disclosed is a quantum cryptography key distribution system. A receiving device of the system includes: a first single-photon detector outputting a data signal including a time-bin encoding pulse indicating a quantum signal; and a TDC receiving a predetermined reference timing signal and the data signal. The TDC is configured to determine a state of a time-bin qubit indicated by the time-bin encoding pulse based on a time difference between a first generation time point of a reference pulse included in the reference timing signal, and a second generation time point of the time-bin encoding pulse generated after the first generation time point.

13 Claims, 16 Drawing Sheets

[Figure 1]
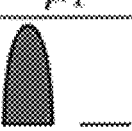

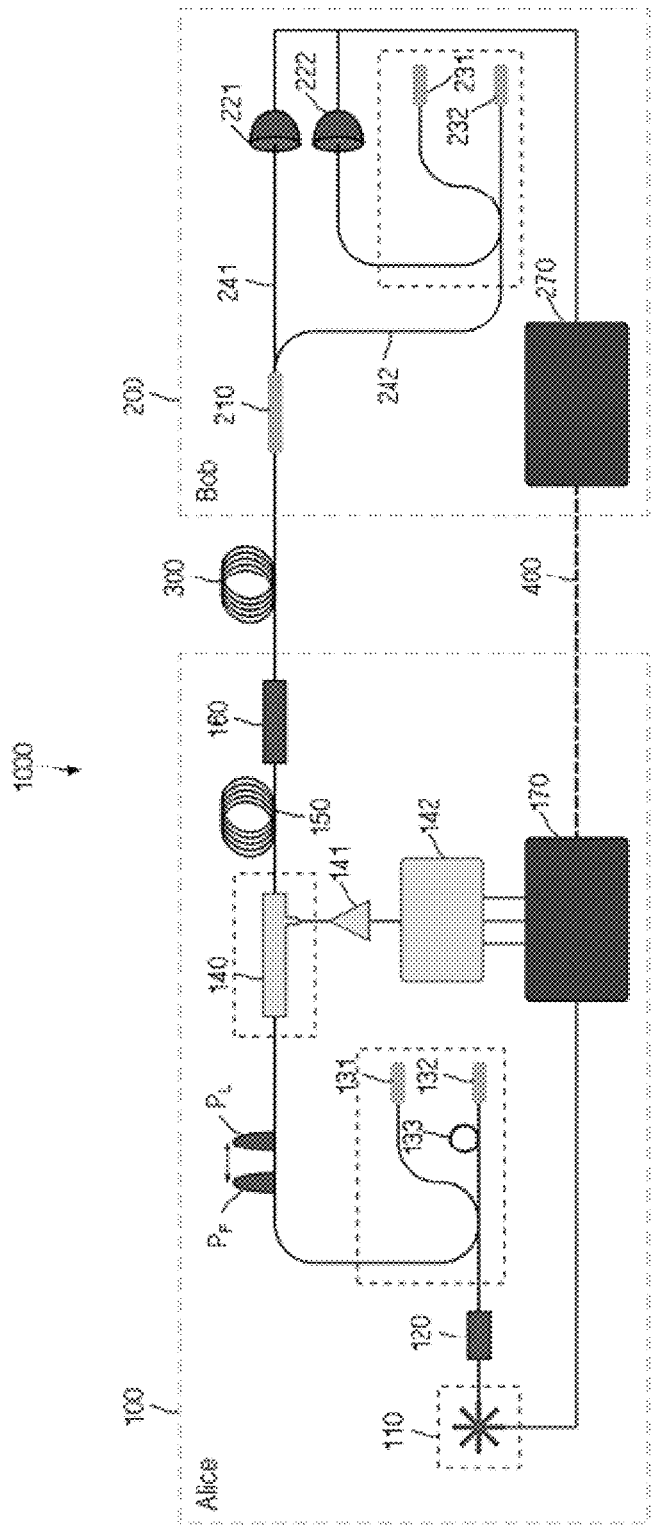
[Figure 2]

[Figure 3]
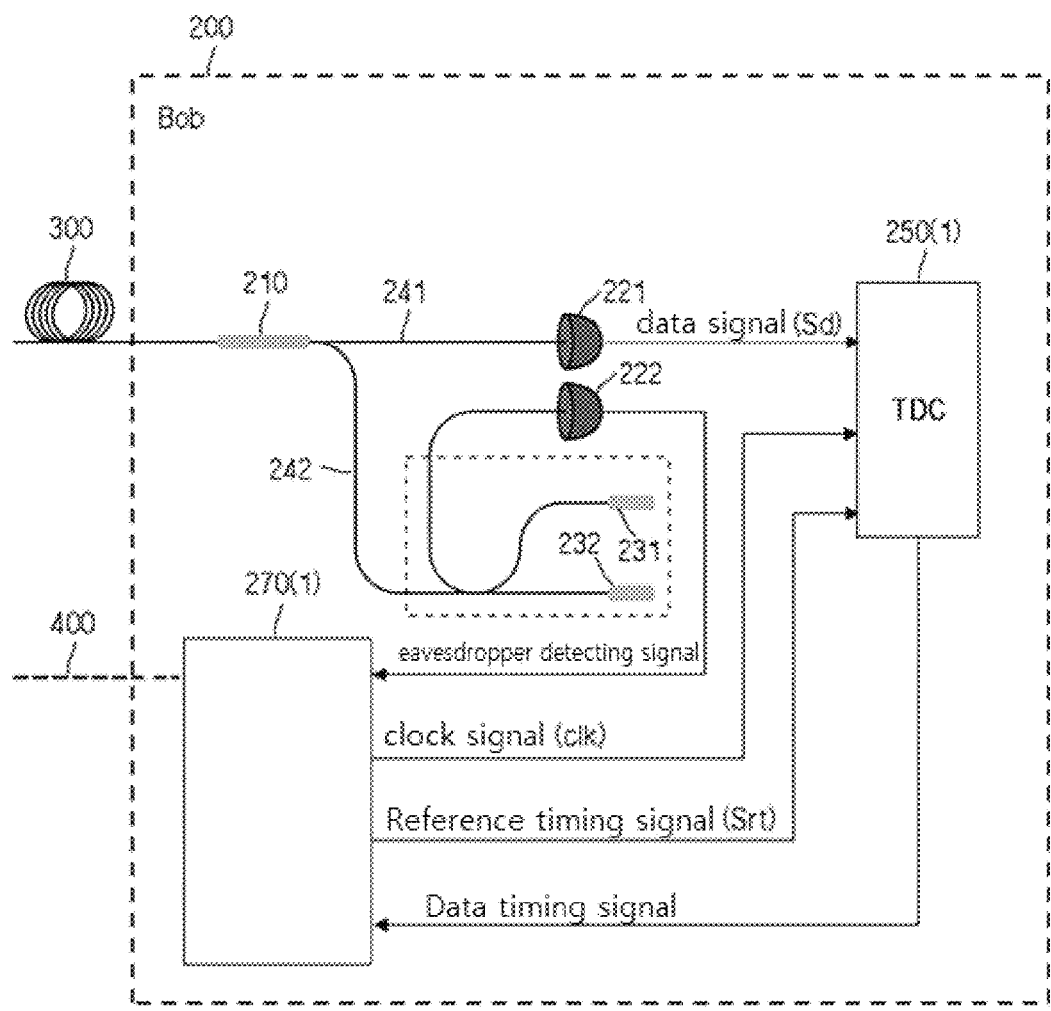

[Figure 4]
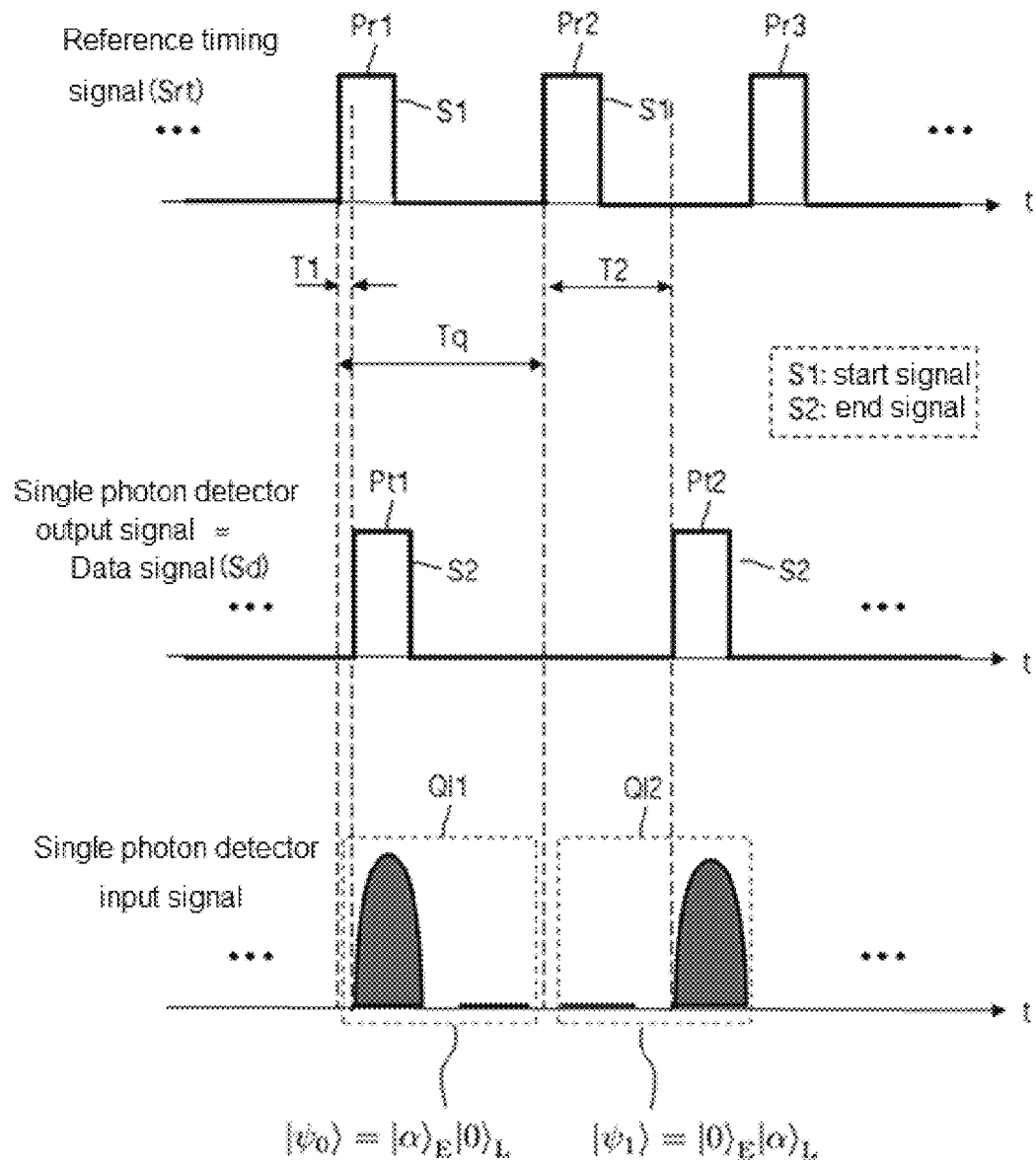

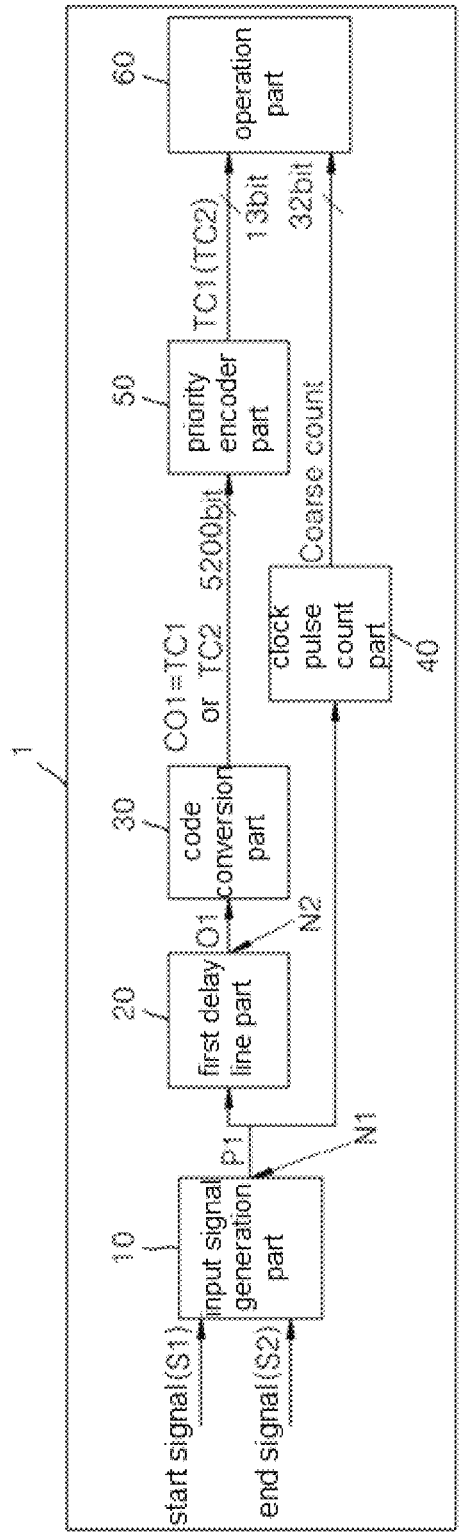
[Figure 5]

[Figure 6]
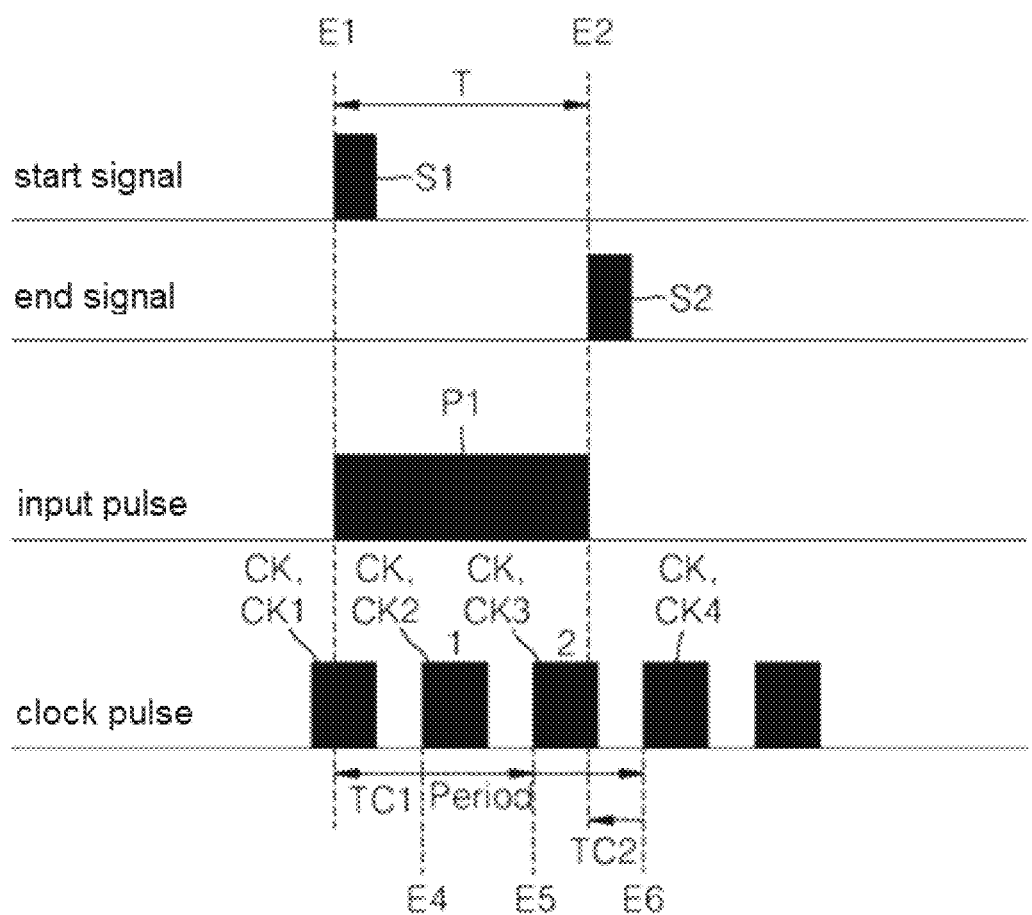

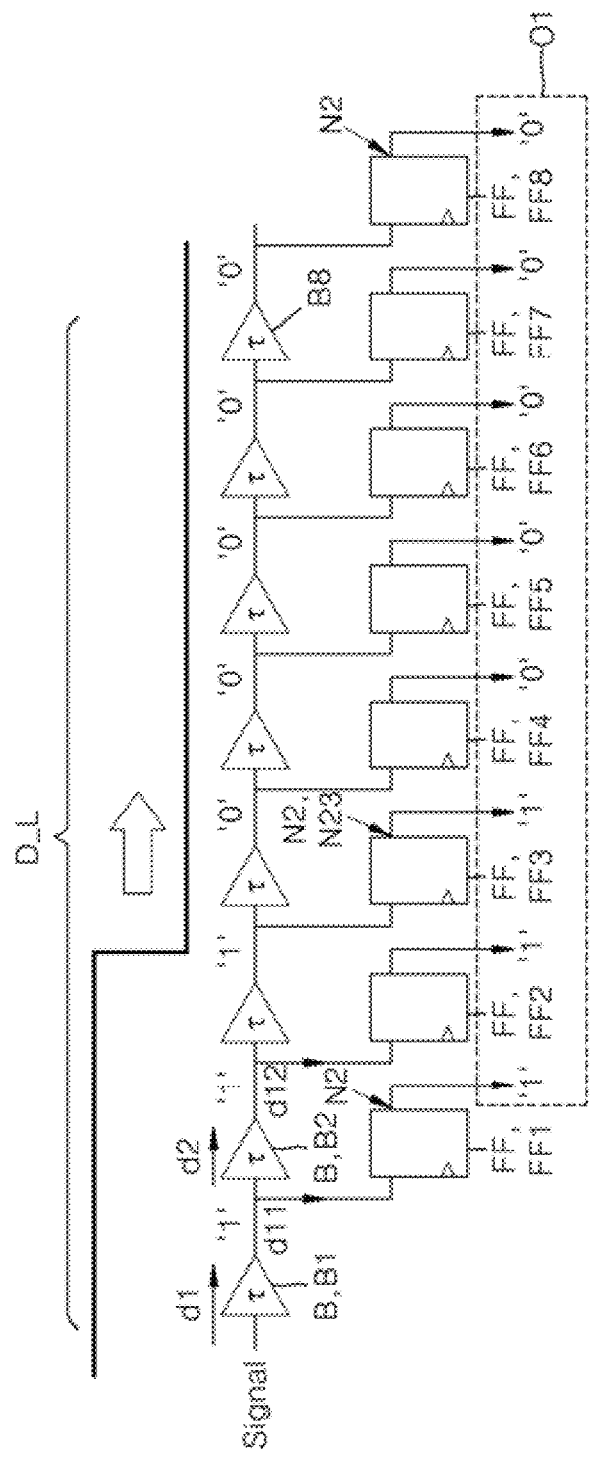
[Figure 7]

[Figure 8]

| Buffer name | Index | Output value |
|---|---|---|
| 1st buffer (B1) | 1 | 1 |
| 2nd buffer (B2) | 2 | 1 |
| 3rd buffer (B3) | 3 | 1 |
| 4th buffer (B4) | 4 | 0 |
| 5th buffer (B5) | 5 | 0 |
| 6th buffer (B6) | 6 | 0 |
| 7th buffer (B7) | 7 | 0 |
| 8th buffer (B8) | 8 | 0 |

[Figure 9]

| Buffer index | value of a 1st delay | value of a 2nd delay | All summed values (Ranking) |
|---|---|---|---|
| 1 | d1 | d11 | (D1=d1+d11)(1) |
| 2 | d2 | d12 | (D2=d1+d2+d12)(2) |
| 3 | d3 | d13 | (D3=d1+d2+d3+d13)(5) |
| 4 | d4 | d14 | (D4=d1+d2+d3+d4+d14)(3) |
| 5 | d5 | d15 | (D5=d1+d2+d3+d4+d5+d15)(4) |
| 6 | d6 | d16 | (D6=d1+d2+d3+d4+d5+d6+d16)(6) |
| 7 | d7 | d17 | (D7=d1+d2+d3+d4+d5+d6+d7+d17)(7) |
| 8 | d8 | d18 | (D8=d1+d2+d3+d4+d5+d6+d7+d8+d18)(8) |

[Figure 10a]
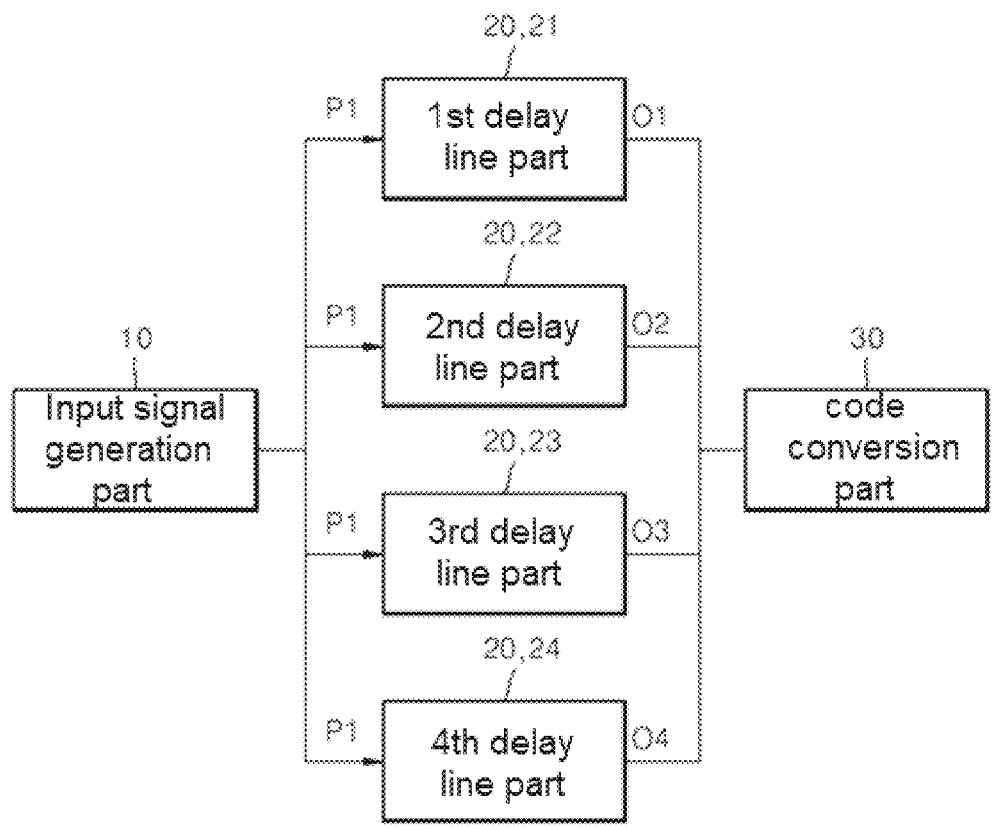

[Figure 10b]
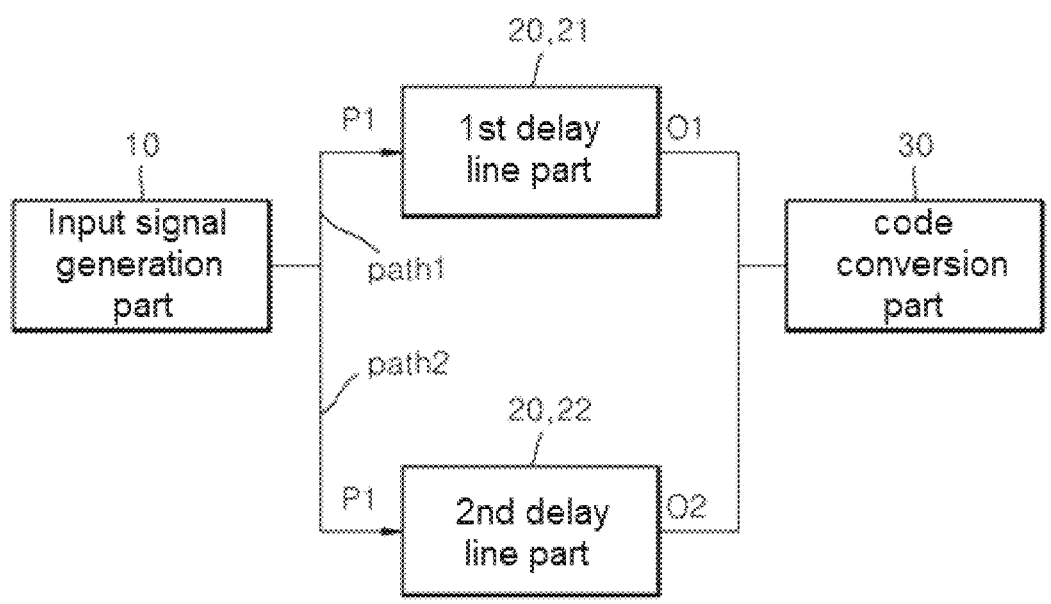

[Figure 11a]
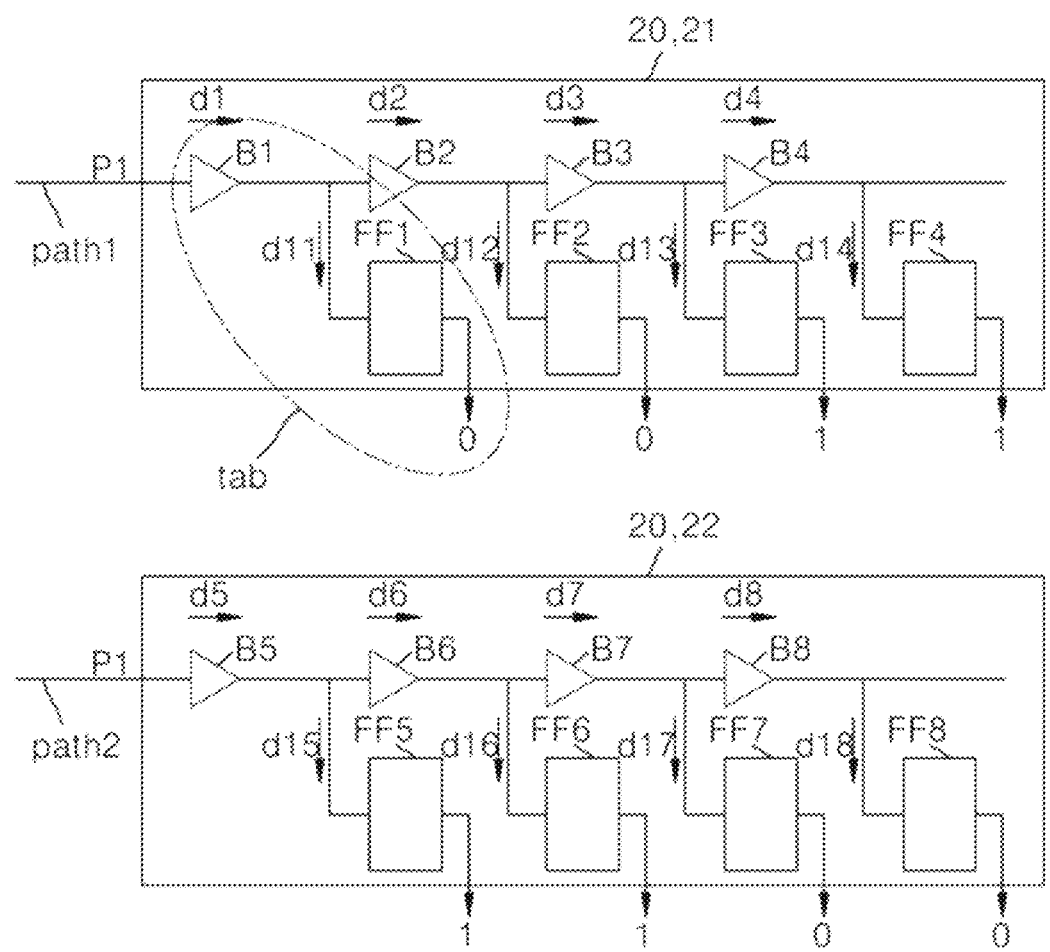

[Figure 11b]

| Delay line part number | Buffer index | Value of a 1st delay | Value of a 2nd delay | 1st summed value (1st ranking) | 1st summed value (total ranking) |
|---|---|---|---|---|---|
| 1 | 1 | d1 | d11 | D1(1) | D1(1) |
| 1 | 2 | d2 | d12 | D2(2) | D2(2) |
| 1 | 3 | d3 | d13 | D3(3) | D3(4) |
| 1 | 4 | d4 | d14 | D4(4) | D4(6) |
| 2 | 5 | d5 | d15 | D5(1) | D5(3) |
| 2 | 6 | d6 | d16 | D6(2) | D6(5) |
| 2 | 7 | d7 | d17 | D7(3) | D7(7) |
| 2 | 8 | d8 | d18 | D8(4) | D8(8) | being sorted based on the order of the lowest sum value = {D1,D2,D5,D3,D6,D4,D7,D8}

[Figure 12]
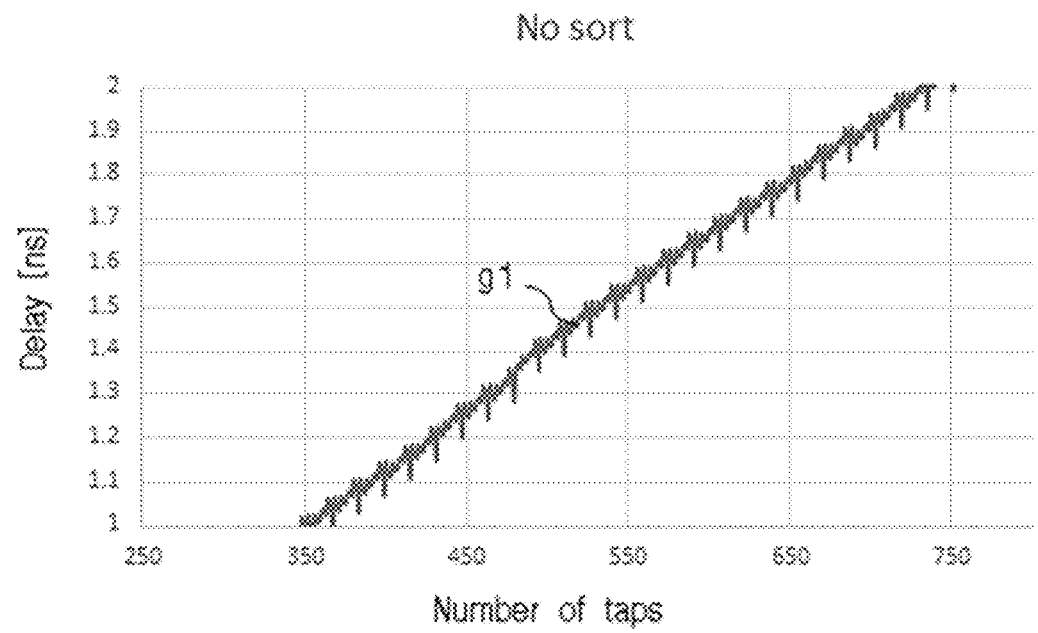
(a)
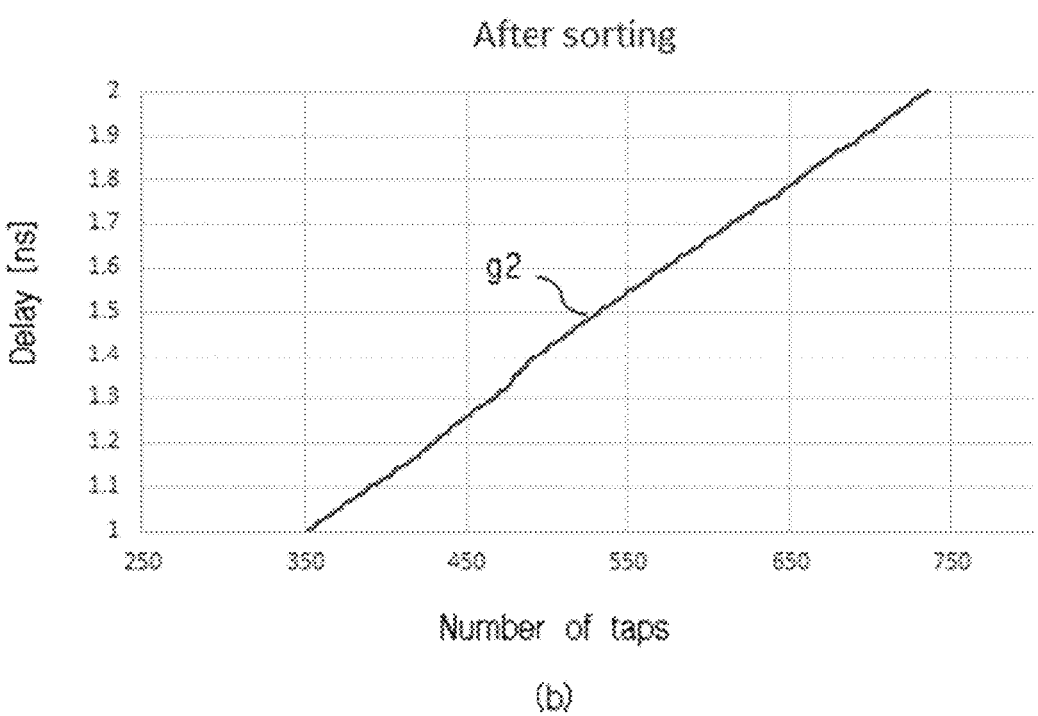
(b)

[Figure 13]

Increasing value of the number of taps →

| Before & after sorting | Array reference of a flip-flop output values | Arrangement order of all delay sum values |
|---|---|---|
| Case 1 (before sorting) | Increasing order of the buffer indexes | D1, D2, D3, D4, D5, D6, D7, D8 |
| Case 2 (after sorting) | size of all delay sum values | D1, D2, D5, D3, D6, D4, D7, D8 |

[Figure 14]
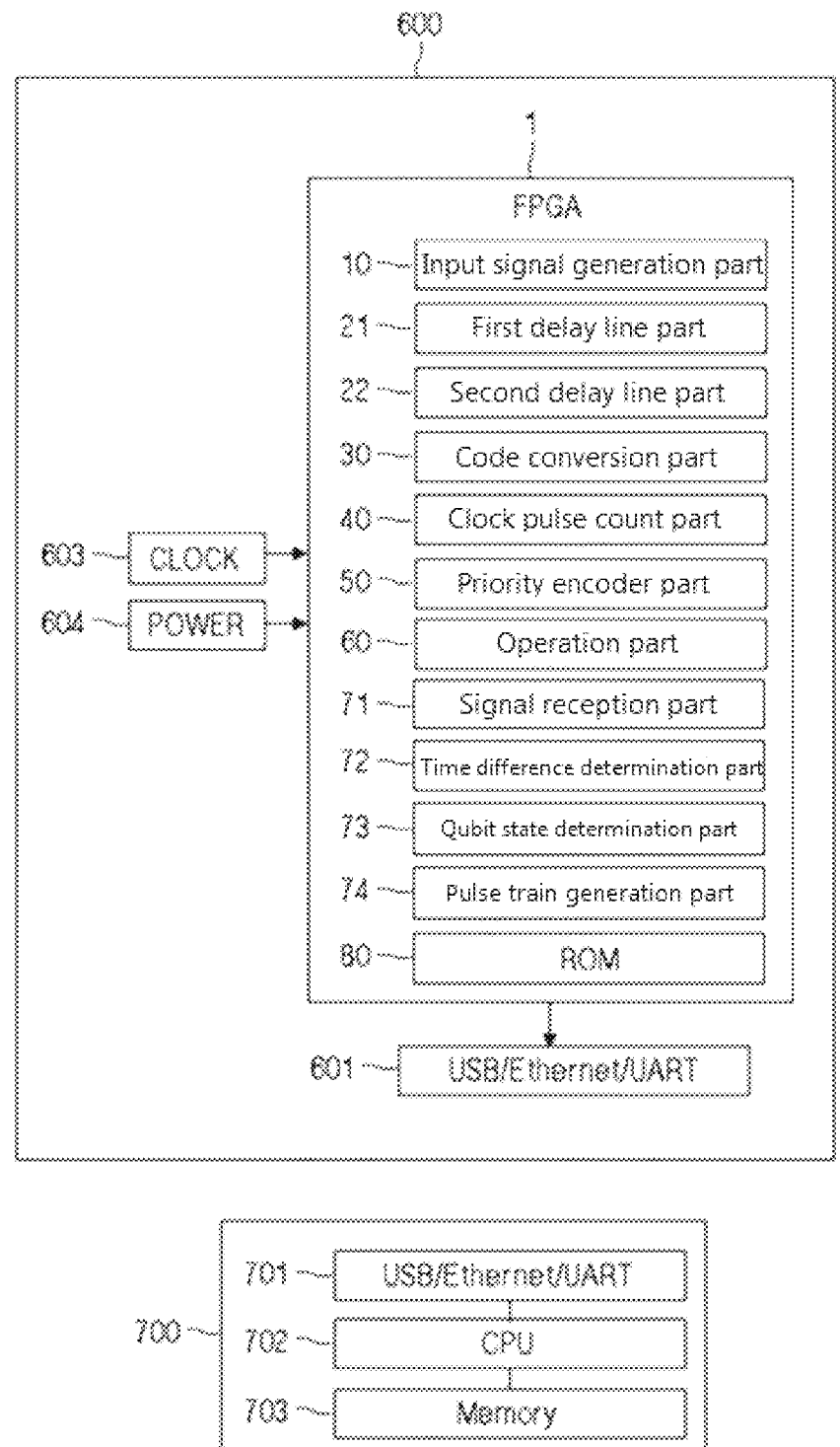

METHOD FOR MEASURING STATES OF TIME-BIN QUBITS IN A QUANTUM CRYPTOGRAPHY KEY DISTRIBUTION SYSTEM USING A TIME-TO-DIGITAL CONVERTER AND A SYSTEM FOR THE SAME

CROSS-REFERENCE TO RELATED APPLICATIONS

This application claims priority to and the benefit of Korean Patent Application No. 10-2023-0089585 filed in the Korean Intellectual Property Office on Jul. 11, 2023, and Korean Patent Application No. 10-2023-0112832 filed in the Korean Intellectual Property Office on Aug. 28, 2023, the entire contents of all these applications being incorporated herein by reference.

TECHNICAL FIELD

The present invention relates to quantum cryptography key distribution technology, and to technology of measuring time-bin qubits using a time-to digital converter (TDC) in a system using a quantum key distribution protocol using a time-bin encoding method.

BACKGROUND ART

Quantum cryptography key distribution technology is being studied as a technology to solve the risk of communication interception. The quantum cryptography key distribution technology is a technology that uses the quantum mechanical properties of photons to distribute and share cryptography keys between remote users. When an attacker (or an eavesdropper) intervenes in a quantum cryptography key distribution process to obtain cryptography key information distributed among users, the presence of an attacker may be detected using that the cryptography key information may be corrupted due to the quantum mechanical properties of photons.

In all quantum cryptography key distribution systems, such as BB84, B92, and T12 protocols, the quantum state can be encoded in a time bin format. Among the quantum key distribution protocols using the time-bin encoding method, the Coherent One Way (COW) quantum cryptography key distribution protocol is a representative quantum cryptography key distribution protocol according to the related art. At this time, a transmitter (Alice) of the cryptography key generates two pulse lasers with a certain phase difference, and the two pulses are transmitted to a receiver (Bob) as one information unit. At this time, a state in which only a temporally preceding pulse among the two pulses is generated represents bit information '0', and in contrast, a state in which only a succeeding pulse is generated represents bit information '1'. And the state in which both pulses are generated represents a decoy state, which is used to detect the presence of an attacker (eavesdropper) (Eve) attacking the quantum cryptography key distribution system. The receiver (Bob) can have a data line to detect the received state and a monitoring line to detect the presence of the attacker. A portion of one pulse to be received by the receiver is transmitted to the data line and used to generate a cryptography key, and the other portion is transmitted to the monitoring line and used to detect the presence of the attacker. At this time, the monitoring line can include a delay interferometer that delays the transmitter (Alice) by a phase interval ($\rho$) used to generate coherent laser pulses, and two photon detectors to detect constructive and destructive interference of the signal. When there is no attack from the attacker, constructive interference can be detected, and when there is an attack, destructive interference can be detected.

SUMMARY OF THE INVENTION

The present invention has been made in an effort to provide a new structure for determining states of time-bin qubits by introducing a time-to-digital converter (TDC) in a quantum cryptography key distribution system using a quantum signal including the time-bin qubits.

According to an aspect of the present invention, a receiving device of a quantum cryptography key distribution system may be provided. The receiving device includes: a data line 241 transmitting a state of a received quantum signal; a first single-photon detector 221 connected to the data line; and a TDC 250 receiving a predetermined reference timing signal Srt and a data signal Sd output by the first single-photon detector. In addition, the TDC is configured to determine a time difference between a generation time of a reference pulse included in the reference timing signal, and a generation time of a time-bin encoding pulse included in the data signal.

At this time, the receiving device may be configured to determine a state of a time-bin qubit indicated by the time-bin encoding pulse by using the time difference.

At this time, the receiving device may further include a second control unit 270 configured to determine a state of a time-bin qubit indicated by the time-bin encoding pulse by using the time difference.

At this time, the reference timing signal may be a pulse train having a period which is the same as the generation period of the qubit generated by the quantum cryptography key distribution system and or a pulse train signal synchronized with the generation period of the qubit.

At this time, the TDC may include a first delay line part 20 receiving an input pulse having, as a width, a time difference between a first generation time point of the reference pulse, and a second generation time point of the time-bin encoding pulse generated after the first generation time point, and an operation part 60 determining the generation time difference by using a thermometer code output by the first delay line part.

At this time, the TDC may further include a code conversion part 30 converting and outputting an order of elements of the thermometer code. In addition, the operation part may be configured to determine the generation time difference by using a conversion code output by the code conversion part, the conversion code may be to sort an order of the elements of the thermometer code according to a predetermined reference, and the predetermined reference may be a data path delay from an output node of the input pulse to an output node of each of a plurality of flip-flops FF included in the first delay line part.

At this time, the TDC may be implemented by an FPGA, and the FPGA may be programmed to include the first delay line part and the operation part.

At this time, the TDC may be implemented by an FPGA, and the FPGA may be programmed to determine the state of the time-bin qubit indicated by the time-bin encoding pulse by using the time difference.

At this time, the TDC may be implemented by any one device of an Application Specific Integrated Circuit (ASIC) and an Integrated Circuit (IC), and the any one device may be configured to determine the state of the time-bin qubit indicated by the time-bin encoding pulse by using the time difference.

At this time, the TDC may further include a second delay line part into which the input pulse is input. In addition, the code conversion part may be configured to generate the conversion code by sorting and merging elements of a thermometer code output by the first delay line part and elements of a thermometer code output by the second delay line part according to a predetermine second reference. In addition, the predetermined second reference may be a data path delay from the output node of the input pulse to an output node of each of a plurality of flip-flops included in the first delay line part and the second delay line part.

At this time, the TDC may be configured to use a clock signal clk having a period shorter than the generation period of the qubit generated by the quantum cryptography key distribution system. In addition, the TDC may further include an input signal generation part 10 generating the input pulse having, as the width, a time difference between a rising edge generation time point of the reference pulse and a rising edge generation time point of the time-bin encoding pulse, and a clock pulse count part 40 counting the number of clock pulses of the clock signal, which are generated during a maintenance period of the input pulse, and the operation part determining a value of the generation time difference by using a first thermometer code TC1 output by the code conversion part at a rising edge time point of a first clock pulse among the generated clock pulses, a second thermometer code TC2 output by the code conversion part at a rising edge time point of a clock pulse generated immediately after a last clock pulse among the generated clock pulses, and the counted number of clock pulses.

At this time, the receiving device may further include a beam splitter 210 receiving the quantum signal In addition, the data line 241 may be connected to the beam splitter.

According to another aspect of the present invention, a quantum cryptography key distribution system including: a transmitting device generating a quantum signal including a time-bin qubit; and a receiving device determining a state of the quantum signal by receiving the quantum signal. At this time, the receiving device includes: a first single-photon detector 221 receiving the quantum signal, and output a data signal Sd including a time-bin encoding pulse indicating the quantum signal, and a TDC 250 receiving a predetermined reference timing signal Srt and the data signal Sd. In addition, the TDC is configured to determine a time difference between a first generation time point of a reference pulse included in the reference timing signal, and a second generation time point of the time-bin encoding pulse generated after the first generation time point.

At this time, the TDC may include a first delay line part 20 into which an input pulse having the time difference as a width is input, a code conversion part 30 converting and outputting an order of elements of the thermometer code output by the first delay line part, and an operation part 60 determining the generation time difference by using a conversion code output by the code conversion part.

At this time, the conversion code may be to sort an order of the elements of the thermometer code according to a predetermined reference, and the predetermined reference may be a data path delay from an output node of the input pulse to an output node of each of a plurality of flip-flops FF included in the first delay line part.

A time-bin qubit measurement method provided according to an aspect of the present invention may be implemented by using a TDC 250 receives a data signal Sd output by the first single photon detector 221 connected to the beam splitter 210 of the receiver 200 and connected to the data line 241 for detecting the received state.

A Time to Digital Converter (TDC) is a device or circuit that converts a time interval between two events into a digital output. The TDC operates by measuring a time difference between two events, for example, signal arrival or signal transmission and reflection at two points in a circuit. In general, a clock period number between two events is counted by using a counter. The count is then converted to a digital output representing the time interval. There are different types of TDCs, such as a leading edge TDC, a trailing edge TDC, and an interpolation TDC. The leading edge TDC measures the time between the leading edge (rising edge) of the start signal and the leading edge of the stop signal (end signal), and the trailing edge TDC measures the time between the trailing edge (falling edge) of the start signal and the trailing edge of the stop signal. The interpolation TDC uses an interpolation technique to estimate the time interval between two clock periods, thereby increasing the resolution of the TDC.

The TDC may be implemented by using Application-Specific Integrated Circuits (ASICs), Microcontrollers (MCUs), Programmable System-on-Chip (PSoC), Digital Signal Processors (DSPs), Field Programmable Analog Arrays (FPAAs), Time-to-Amplitude Converters (TACs), Time-to-Frequency Converters (TFCs), and Field Programmable Gate Array (FPGA).

When implementing the TDC using the FPGA, there may be the following problems. First, the resources provided in the FPGA, including logic cells, lookup tables (LUTs), and routing channels, are limited, which may limit the resolution and accuracy of the TDC implemented in the FPGA. Second, at high clock frequencies, jitter may introduce errors into TDC measurements. Here, the jitter refers to the variation that occurs in the timing of the clock signal due to factors such as noise and temperature. Third, factors such as voltage drops, temperature changes, and manufacturing process differences may cause the TDC to exhibit nonlinear behavior, which may result in errors being introduced into the TDC measurement at high resolution. Fourth, the FPGA introduce delays through signal processing and routing, and these delays may introduce errors into TDC measurements for small time intervals.

In the FPGA, routing refers to a process of connecting programmable logic elements (such as lookup tables, flip-flops, and multiplexers) on a chip to form the desired logic circuit. Routing may determine a scheme in which signals are propagated through the chip and have a significant impact on the overall performance of the design. One of the main factors that may cause delays in FPGA routing is a capacitance of the interconnect wires that connect logic elements. As the number of logic elements and the distance between the logic elements increases, the capacitance of the interconnect wires also increases. This capacitance may delay signal propagation through the wires, increasing overall design delay. Another factor that may cause delays in the FPGA routing is routing congestion. When the FPGA routing resources are limited and the number of logical elements that need to be connected is large, the routing congestion occurs. The routing congestion may cause delays because the routing congestion increases the distance between logic elements, which increases the capacitance of the interconnect wires.

A tapped delay line is a digital signal processing technique used to implement the thermometer code. In the thermometer code, each bit of the binary number is represented as a separate signal line, and a line corresponding to the bit that is "on" indicates what the value of the binary number represents. To implement the thermometer code using the tapped delay lines, a series of delay elements are used, each representing each bit. The input binary number is converted into a series of pulses, each pulse representing 1 bit of the binary number. These pulses are delayed by a different amount depending on each bit position and then fed to the tapped delay line. At the output of the tapped delay line, each output signal line represents a bit of a binary number, and a line that is "on" represents a binary number value. This technology is commonly used to convert a digital signal to an analog signal in a digital-to-analog converter (DAC).

In the FPGA, a carry chain block is a hardware block used to perform fast arithmetic operations, especially addition and subtraction. In the digital circuit, addition and subtraction of multi-bit numbers requires calculation of carry bits, and a bottleneck may occur in a high-speed operation. The carry chain block efficiently processes the calculation of the carry bits, enabling faster and more efficient arithmetic operations. The carry chain block generally consists of a series of full adder circuits interconnected in a specific scheme to form a carry chain. Each full adder circuit calculates one bit at the output and a carry bit which is transmitted to a next step in the chain. By connecting the full adder circuits by the chain, the carry bit is propagated through the chain during one clock cycle, allowing fast addition and subtraction of multi-bit numbers. In addition to providing the fast arithmetic operations, the carry chain block may also be used to implement the counter and the delay circuit that require calculation of the carry bit.

A timing report tool is a software tool used for analyzing a timing performance of a design implemented in the FPGA. The tool creates a report that provides information on a timing characteristic of the design. The report includes information on the timing characteristic of the design, which includes a data path delay, a critical path, a setting time and a retention time, a clock skew, and a maximum operating frequency. The data path delay is a time required for the data signal to be propagated through a logical element of the FPGA.

A multiplexer, or "MUX" for short, is an electronic circuit that selects one of several input signals and delivers the selected input to an output line. An input-output structure of the multiplexer generally consists of several input lines, a selection line, and one or more output lines. The number of input lines coincides with the number of input signals which may be selected by the multiplexer, and the selection line determines the selected input signal. For example, a 4-to-1 multiplexer has four input lines, one output line, and a select line that determines which of the four input signals is transmitted as the output. The selection line may be controlled by a binary code representing the selected input line. The multiplexer is often used in a digital system to reduce the number of wires needed to transmit data and control signals. The multiplexer may be used to implement functions such as a data selector, a memory address decoder, and a bus allocation circuit.

According to yet another aspect of the present invention, an electronic device-readable non-volatile recording medium may be provided, which has a binary file including configuration data configured to program an FPGA recorded therein. At this time, the FPGA is an FPGA included in a quantum cryptography key distribution system. The configuration data is configured to program the FPGA to configure a digital circuit including a signal reception part receiving a data signal Sd output by a first single-photon detector; and a time difference determination part configured to determine a time difference between a generation time of a reference pulse included in a predetermined reference timing signal Srt, and a generation time of a time-bin encoding pulse included in the data signal.

At this time, the digital circuit may further include a qubit state determination part configured to determine a state of a time-bin qubit indicated by the time-bin encoding pulse by using the time difference.

At this time, the digital circuit may further include a pulse train generation part generating a pulse train having a period which is the same as a generation period of a qubit generated by the quantum cryptography key distribution system. At this time, the reference timing signal may be the pulse train.

At this time, the digital circuit may further include a first delay line part 20 receiving an input pulse having, as a width, a time difference between a first generation time point of the reference pulse, and a second generation time point of the time-bin encoding pulse generated after the first generation time point, and an operation part 60 determining the generation time difference by using a thermometer code output by the first delay line part.

At this time, the digital circuit may further include a code conversion part 30 converting and outputting an order of elements of the thermometer code. In addition, the operation part may be configured to determine the generation time difference by using a conversion code output by the code conversion part, the conversion code may be to sort an order of the elements of the thermometer code according to a predetermined reference, and the predetermined reference may be a data path delay from an output node of the input pulse to an output node of each of a plurality of flip-flops FF included in the first delay line part.

At this time, the digital circuit may further include a second delay line part into which the input pulse is input. The code conversion part may be configured to generate the conversion code by sorting and merging elements of a thermometer code output by the first delay line part and elements of a thermometer code output by the second delay line part according to a predetermine second reference. In addition, the predetermined second reference may be a data path delay from the output node of the input pulse to an output node of each of a plurality of flip-flops included in the first delay line part and the second delay line part.

At this time, the digital circuit may be configured to use a clock signal clk having a period shorter than the generation period of the qubit generated by the quantum cryptography key distribution system. In addition, the digital circuit may further include an input signal generation part generating the input pulse having, as the width, a time difference between a rising edge generation time point of the reference pulse and a rising edge generation time point of the time-bin encoding pulse, and a clock pulse count part counting the number of clock pulses of the clock signal, which are generated during a maintenance period of the input pulse, and the operation part determining a value of the generation time difference by using a first thermometer code output by the code conversion part at a rising edge time point of a first clock pulse among the generated clock pulses, a second thermometer code output by the code conversion part at a rising edge time point of a clock pulse generated immediately after a last clock pulse among the generated clock pulses, and the counted number of clock pulses.

According to the present invention, a new structure for determining states of time-bin qubits can be provided by introducing a time-to-digital converter (TDC) in a quantum cryptography key distribution system using a quantum signal including the time-bin qubits.

There is an effect in that the TDC having the structure provided by the present invention can also be implemented by an FPGA which operates at hundreds of Mhz, which is an operating speed lower than 10 GHz.

BRIEF DESCRIPTION OF THE DRAWINGS

FIG. 1 illustrates three quantum states used in a quantum cryptography key distribution system provided according to an exemplary embodiment of the present invention.

FIG. 2 illustrates a configuration of a quantum cryptography key distribution system provided according to an exemplary embodiment of the present invention.

FIG. 3 illustrates a configuration of a receiving device of the quantum cryptography key distribution system including a TDC provided according to an exemplary embodiment of the present invention.

FIG. 4 illustrates an example of a data signal and a reference timing signal provided to the TDC provided according to an exemplary embodiment of the present invention.

FIG. 5 illustrates a configuration diagram of the TDC according to an exemplary embodiment of the present invention.

FIG. 6 is a diagram for describing an input pulse input into a first delay line part according to an exemplary embodiment of the present invention.

FIG. 7 illustrates a configuration of the first delay line part according to an exemplary embodiment of the present invention.

FIG. 8 is a diagram for describing indexes of buffers in FIG. 7.

FIG. 9 illustrates a table for describing a data path delay.

FIGS. 10A and 10B illustrate a plurality of delay line parts arranged in parallel according to an exemplary embodiment of the present invention.

FIG. 11A illustrates configurations of the first delay line part and a second delay line part in FIG. 10B, and FIG. 11B illustrates an operation of a code conversion part when two delay line parts are used according to an exemplary embodiment of the present invention.

FIG. 12 illustrates a graph of a delay according to whether to apply the code conversion part according to an exemplary embodiment of the present invention.

FIG. 13 is a diagram for describing an array reference of a flip-flop output values according to whether to apply the code conversion part and an increase value of the number of taps of FIG. 12 according to an exemplary embodiment of the present invention.

FIG. 14 is a block diagram illustrating a primary function unit of a PCB including an FPGA provided according to an exemplary embodiment of the present invention.

DETAILED DESCRIPTION

Hereinafter, exemplary embodiments of the present invention will be described with reference to the accompanying drawings. However, the present invention is not limited to the exemplary embodiments described herein and can be implemented in several different forms. Terms used in this specification are used to help understand the exemplary embodiments, and are not intended to limit the scope of the present invention. Further, the singular forms used below include plural forms as well, if the phrases do not clearly have the opposite meaning.

A protocol used in a quantum cryptography key distribution system 1000 provided according to an exemplary embodiment of the present invention is based on the time-bin encoding method.

A general form of one qubit is as illustrated in Equation 1.

$$|\psi\rangle = c0|\psi 0\rangle + c1 e i\Phi |\psi 1\rangle \quad \text{[Equation 1]}$$

However, $c0^2 + c1^2 = 1$

The time-bin qubit consists of two time modes, denoted early (E) and late (L). The time-bin qubits are approximated to weak coherent states a such as $|\psi 0\rangle = |\alpha\rangle E |0\rangle L$ and $|\psi 1\rangle = |0\rangle E |\alpha\rangle L$. Many QKD implementations use four BB84 states of a format such as $|\psi\rangle = (|\psi 0\rangle + e i\Phi |\psi 1\rangle)/\text{root}(2)$ (however, $\Phi = \{0, \pi/2, \pi, 3\pi/2\}$).

FIG. 1 illustrates three quantum states used in a quantum cryptography key distribution system provided according to an exemplary embodiment of the present invention.

In an exemplary embodiment of the present invention, only three quantum states with the encoding illustrated in FIG. 1 are used.

A transmitter (Alice) encodes a bit 0 or 1 to a state $|\psi 0\rangle$ or $|\psi 1\rangle$ in a Z basis used for generating a raw key.

An X basis may be used for estimating eavesdropper's information. In this basis, the transmitter (Alice) sends $|\psi+\rangle = (|\psi 0\rangle + |\psi 1\rangle)/\text{root}(2)$.

Possibilities to select the Z basis and the X basis are pZA and pXA, respectively. Since weak coherent pulses are used, a photon number splitting attack may be prevented by using a decoy state method.

Three quantum states may be implemented by only two different average photon numbers $\mu 1$ and $\mu 2\mu$, referred to as signal and decoy respectively. An average photon number of each qubit $\mu = |\alpha|2$, is randomly selected between $\mu 1$ and $\mu 2$ at corresponding probabilities p1 and p2.

A receiver (Bob) measures qubits by the Z basis or X basis by using probabilities pZB and pXB, respectively. The Z basis measurement is a direct measurement of an arrival time of a photon that allows the receiver to recover a bit value. In the X basis, the coherence between two consecutive pulses is measured via an unbalanced interferometer.

FIG. 2 illustrates a configuration of a quantum cryptography key distribution system 1000 provided according to an exemplary embodiment of the present invention. The transmitter (Alice) 100 is a transmitting device that transmits pulses, and includes a laser 110, a filter 120, a piezoelectric fiber stretcher 133, a transmission-side first Faraday mirror 131, a transmission-side second Faraday mirror 132, an intensity modulator (IM) 140, an RF amplifier 141, a digital analog converter (DAC) 142, a first control unit 170, a dispersion compensating fiber (DCF) 150, and a variable attenuator (VA) 160.

For example, the laser 110 may be a 1550-nm fast gain-switched distributed feedback laser, the filter 120 may be a 270-pm bandpass filter, and the first control unit 170 may be an FPGA operating at 10 Ghz, but the present invention is not limited thereto.

The receiver (Bob) 200 used in an exemplary embodiment of the present invention is a receiving device that receives pulses, and may include a beam splitter (BS) 210, a data line 241 connected to the beam splitter 210 and detecting a received state, a monitoring line 242 connected to the beam splitter 210 and detecting the presence of the attacker, a first single-photon detector (SPD) 221 connected to the data line 241, a second single-photon detector 222 connected to the monitoring line 242, a reception-side first Faraday mirror 231, a reception-side second Faraday mirror 232, a time to digital converter (TDC) 250, and a second control unit 270.

The first SPD 221 and the second SPD 222 as devices that detect individual photons may also be referred to as single-photon detectors. The single-photon detectors are designed to detect individual photons with high sensitivity, and configured to distinguish whether there is a single photon with reliability without easily reacting to noise or background light. In QKD, various types of single-photon detectors may be used. The single-photon detector may be Avalanche Photodiodes (APDs), Superconducting Nanowire Detectors (SNSPDs), or Single Photon Avalanche Diodes (SPADs), and also be devices of different types therefrom. The single-photon detectors are based on different principles, respectively, and have a common characteristic of being able to detect one photon.

The second control unit 270 may be, for example, an FPGA that operates at a high-speed clock of 10 Ghz, but the present invention is not limited thereto. The second control unit 270 may be, for example, an FPGA that operates at a clock lower than 10 Ghz.

The pulse generated by the transmitter 100 used in an exemplary embodiment of the present invention may be transmitted to the receiver 200 through a quantum channel 300. The quantum channel 300 may be composed of, for example, a single-mode fiber (SMF).

Each of the devices of the transmitter (Alice) and the receiver (Bob) may be controlled by a field programmable gate array (FPGA) with an fX GHz sampling speed, for example. The transmitter (Alice) and the receiver (Bob) may be synchronized through an fX GHz small form-factor pluggable (SFP) transceiver based optical service channel. The quantum channel may consist of a spool of single-mode fiber (SMF) with an attenuation of approximately 0.2 dB/km. Here, the fX may be, for example, 10 or a smaller number.

The transmitter (Alice) 'side'? uses the laser 110 to generate a pulse with a random phase, for example, at a speed of 2.5 GHz. A narrowband filter (270 pm) limits a spectrum of a light pulse and thereby limits a chromatic dispersion effect of an optical fiber link. Further, since the pulse is chirped, the duration of filtering is reduced to approximately 30 ps. Then, the pulse passes through an unbalanced Michelson interferometer in which an arm length difference is 200 ps. Such an effect is to split each pulse into two pulses having coherence states with each other. On one arm, the optical fiber may wrap around a piezoelectric cylinder that is used to adjust an interferometer phase.

In order to encode three states illustrated in FIG. 2, three states may be implemented with only one intensity modulator (IM) 140.

A qubit state and a pulse amplitude to be encoded may be randomly selected by the first control unit 170. For this purpose, the first control unit 170 may use a pseudo-random number generator. A high-speed output from the first control unit 170 is connected to a 3-bit programmable digital-to-analog converter (DAC) 142, which generates a radio frequency (RF) pulse with an appropriate amplitude. An output of the DAC 142 is further amplified by the RF amplifier 141. These pulses drive a lithium niobate (LiNbO3) IM [IXblue], which regulates the intensity of the pulses exiting the interferometer. Using the DAC, only four independently adjustable levels may be generated. These four levels correspond to average photon numbers $\mu 1$, $\mu 2=\mu 1/2$, $\mu 2/2$, and 0 after final attenuation. Therefore, the four levels are limited to $\mu 2=\mu 1/2$. This ratio is close to an optimal value at almost all distances.

The dispersion compensating fiber (DCF) 150 pre-compensates the chromatic dispersion of the quantum channel. Without this DCF 150, the overlap between two consecutive pulses at the receiver (Bob) side after 50 km dramatically increases a quantum bit error rate (QBER). Since the DCF 150 is a part of the transmitter (Alice), attenuation of the quantum channel is not added due to the DCF 150.

Finally, the variable attenuator 160 placed at the output of the transmitter (Alice) attenuates the signal to set the desired average photon number of the outgoing pulse.

The receiver (Bob) 200 side selects a measurement basis manually through the beam splitter 210 in which a split ratio between the Z basis and the X basis is rZ:rX (rZ+rX=100). The split ratio may be optimized according to each transmission distance. In the Z basis, the state is transmitted directly to the first single photon detector 221, which measures an arrival time of the photon. A measurement result is $|\psi 0\rangle$ or $|\psi 1\rangle$. In the X basis, there is the unbalanced Michelson interferometer having the same delay as the transmitter (Alice) side. After this second interferometer, three pulses, i.e., a central interfering and two side peaks are observed. Interferometer delay is exactly half a clock period, so side peaks of adjacent qubits overlap at an output port. A phase difference between the interferometers of the transmitter (Alice) and the receiver (Bob) may be fixed so that detection in a central interfering time-bin corresponds to a state $|\psi -\rangle =(|\psi 0\rangle -|\psi 1\rangle)/\text{root}(2)$. Photons projected to the state $|\psi +\rangle =(|\psi 0\rangle +|\psi 1\rangle)/\text{root}(2)$ exit from the interferometer through a second port, i.e., an input port. Such an event is not detected. The phase difference is kept constant by a feedback loop that takes the QBER of the X basis as an error signal. Additionally, to compensate for variations in the length of the quantum channel, an automatic feedback loop continuously adjusts an electrical delay placed between the detectors and the FPGA. Since sampling by the FPGA is performed at, for example, 10 GHz, detection bins corresponding to $|\psi 0\rangle$ and $|\psi 1\rangle$ are separated into "bin" and an empty time bin that may be used for time tracking.

FIG. 3 illustrates a configuration of a receiver (Bob) 200 of the quantum cryptography key distribution system including a TDC provided according to an exemplary embodiment of the present invention.

The receiver (Bob) 200 may further include a TDC 250.

The TDC 250 is used for measuring the Z basis state.

The TDC 250 receives a data signal Sd output by the first single photon detector 221 connected to the beam splitter 210 of the receiver 200 and connected to the data line 241 detecting the received state.

The data signal Sd output by the first single photon detector 221 may be a binary signal with a value of 0 or 1. The time-dependent waveform of the data signal Sd may have a pulse train form in which pulses are generated. For example, the first single photon detector 221 may be a device that outputs a pulse with a predetermined duration when a single photon is input and detected.

Further, the TDC 250 may receive a clock signal clk. The clock signal may be a train of clock pulses counted by the TDC 250. The clock signal clk may be a clock pulse used in the TDC presented in FIG. 6.

Further, the TDC 250 receives a predetermined reference timing signal Srt.

The reference timing signal Srt may be provided by the second control unit 270.

The transmitter 100 and the receiver 200 may share information on a transmission period of a series of qubits. Further, the receiver 200 may obtain information on a time point or a time interval of starting transmission of a series of qubits by the transmitter 100, and as a result, the receiver 200 may be prepare for reception of transmitted qubits. In addition, the receiver 200 may synchronize a time point at which the single photon reaches the receiver 200, and a detection time point at which the receiver 200 detects the single photon. Specific configurations for the above-described technology are already well known in this technical field.

In an exemplary embodiment, the single-photon detector may be configured to operate only when an enable signal input to the single-photon detector is in a specific logic state (e.g., logical high). And the reference timing signal Srt may be provided as the enable signal. The generation period of the series of pulses included in the reference timing signal Srt may match the generation period of the qubits generated by the transmitter 100.

In addition, the TDC 250 may generate a data timing signal, which is a signal containing a value indicating a generation time point of the pulse included in the data signal Sd, and provide the data timing signal to the second control unit 270. At this time, the data timing signal may be a value representing a difference between the generation time point of the pulse included in the data signal Sd and a generation time point of a specific pulse in the reference timing signal Srt corresponding thereto.

FIG. 4 illustrates an example of a data signal and a reference timing signal provided to the TDC provided according to an exemplary embodiment of the present invention.

The reference timing signal (Srt) may be a pulse train with a predetermined period. The pulse period Tq of the pulse train may be the same as a transmission period of unit information transmitted by the transmitter (Alice) 100. That is, the pulse period Tq may be the same as the transmission period of the qubits transmitted by the transmitter 100.

Each pulse of the reference timing signal Srt, that is, each reference pulse (Pr1, Pr2, Pr3, . . . ) is regarded as a start signal S1, which will be described later.

The data signal Sd presented in FIG. 4 is illustrated as including a first time-bin qubit (first qubit information) (QI1) and a second time-bin qubit (second qubit information) (QI2).

Each pulse included in the data signal Sd, that is, each time-bin encoding pulse (Pt1, Pt2, . . . ) is regarded as an end signal S2, which will be described later.

In the example of FIG. 4, a first time-bin qubit (QI1) represents a state ($|\psi 0\rangle = |\alpha\rangle E |0\rangle L$) in which the time-bin encoding pulse is present only in an early time-bin E between the early time-bin E and a late time-bin L, and a second time-bin qubit QI2 represents a state in which ($|\psi 1\rangle = |0\rangle E |\alpha\rangle L$) in which ($\psi$, Sub) in which the time-bin encoding pulse is present only in the late time-bin L between the early time-bin E and the late time-bin L.

The TDC 250 measures a generation time difference T between a rising edge of a reference pulse S1 of the reference timing signal Srt and a rising edge of a time-bin encoding pulse S2 of a data signal generated immediately following the reference pulse. The measurement may be repeatedly made with respect to all reference pulses of the reference timing signal Srt.

When a width of one reference pulse S1 and a width of one time-bin encoding pulse S2 are the same, the TDC 250 may also be transformed to measure a generation time difference between a falling edge of the reference pulse S1 and a falling edge of the time-bin encoding pulse S2.

The generation time difference T may be substantially T1 or T2, and the time-bin qubit measured when the generation time difference T is T1 may be a state ($|\psi 0\rangle$) indicating a bit '0', and the time-bin qubit measured when the generation time difference is T2 may be a state ($|\psi 1\rangle$) indicating a bit '1'.

When the pulse generation time point of the reference timing signal Srt used by the receiver 200 is precisely synchronized with the arrival time point of the photon input to the single-photon detector, T1=0.

In FIG. 4, T1<T2. However, depending on a specific value of a relative phase between the reference timing signal Srt and the data signal Sd, T1>T2 may also be established. The relative phase between the reference timing signal Srt and the data signal Sd may be controlled by the quantum cryptography key distribution system 1000.

The above-described generation time difference T may be included in the data timing signal described in FIG. 3 and provided to the second control unit 270.

Hereinafter, an operation principle of the TDC 250 provided according to an exemplary embodiment of the present invention will be described in detail. The TDC 250 may be implemented as the FPGA 1.

FIG. 5 illustrates a configuration diagram of the FPGA implementing the TDC according to an exemplary embodiment of the present invention.

When the second control unit 270 illustrated in FIG. 3 is the FPGA, the FPGA 1 that implements the TDC 250 may be the second control unit 270.

In contrast, when the second control unit 270 illustrated in FIG. 3 is not the FPGA, the TDC 250 may be implemented as an FPGA that is provided separately from the second control unit 270.

The TDC 250 may also be implemented as a relatively low-speed FPGA operating at a clock of, for example, 100 to 300 Mhz other than the high-speed FPGA operating at the clock of, for example, 10 GHz.

FIG. 6 is a diagram for describing an input pulse input into a first delay line part according to an exemplary embodiment of the present invention.

Hereinafter, the present invention will be described with reference to FIGS. 5 and 6 jointly.

The FPGA 1 may include an input signal generation part 10, a first delay line part 20, a code conversion part 30, a clock pulse count part 40, a priority encoder part 50, and an operation part 60.

Specifically, the configurations of the FPGA 1 described above may be configurations of the time to digital converter (TDC).

As illustrated in FIG. 5, the input signal generation part 10 may generate an input pulse P1 having, as a width, a generation time difference T between the rising edge E1 of a predetermined given start signal S1 and the rising edge E2 of a predetermined given end signal S2. The input signal generation part 10 may be composed of logic gates necessary for the above generation.

The first delay line part 20 may receive an input pulse P1 having, as the width, a generation time difference T between the start signal S1 and the end signal S2. And the first delay line part 20 may output a thermometer code O1. At this time, the thermometer code is, for example, an 8-bit value composed of output values of flip-flops included in the first delay line part 20, and the output value of each flip-flop may be referred to as an element of the thermometer code.

FIG. 7 illustrates a configuration of the first delay line part according to an exemplary embodiment of the present invention.

FIG. 8 is a diagram for describing indexes of buffers in FIG. 7.

The first delay line part 20 may include a delay line D_L including a plurality of buffers (delay elements, delay elements) B and D-flip-flops FF tapped to an output terminal of each buffer B of the delay line.

The plurality of buffers may be connected in a cascade delay scheme. That is, the plurality of buffers may be arranged according to an order in which the input pulse P1 flows.

A waveform (signal) of the input pulse P1 of FIG. 7 may be output from an output terminal of each buffer B with a predetermined delay. That is, an output value of a first buffer B1 is output with a predetermined delay from an output terminal of the first buffer B1, and the output terminal of the first buffer B1 is connected to an input terminal of a second buffer B2. The output value (e.g., '1') of the first buffer B1 may also be input to a first flip-flop FF1.

At this time, a data path delay may occur between each buffer B and while passing through the flip-flop FF. For example, a delay of d1 may occur until the input value ('1') of the first buffer B1 is transmitted to the second buffer B2, and a delay of d11 may occur until the output value ('1') of the first buffer B1 is transmitted to the first flip-flop FF1. Likewise, a delay may occur whenever data is transmitted from a previous buffer to a next buffer, and a delay may occur whenever data is transmitted from any buffer to a flip-flop connected to any buffer.

FIG. 8 is a diagram for describing an index of a buffer according to an exemplary embodiment of the present invention.

Respective fields in a table of FIG. 8 indicate a buffer name, an index, and an output value of the buffer.

An index for defining the order of each buffer may be assigned to each buffer. For example, index '1' may be assigned to the first buffer B1, index '2' may be assigned to the second buffer B2, and similarly, index '8' may be assigned to an eighth buffer B8. In this way, when each buffer B is arranged according to the order in which the input pulse P1 flows and the indexes are arranged according to the order, for example, indexes of 1 to 1000 may be assigned to 1000 buffers, respectively.

FIG. 9 illustrates a table to describing a data path delay.

Referring to FIGS. 5 and 9, the code conversion part 30 may convert and outputs the order (e.g., 1, 2, 3, 4, 5, 6, 7, 8) of elements of the thermometer code O1 (e.g., 11100000) output from the first delay line part 20. At this time, the code (e.g., 11010000) output by the code conversion part 30 (the order of the indexes of the corresponding buffer is 1, 2, 4, 5, 3, 6, 7, 8) is called 'conversion code CO1'.

The conversion code CO1 output by the code conversion part 30 may be an order of elements of the thermometer code O1 arranged according to a predetermined reference. At this time, the predetermined reference may be the data path delay the output node N1 of the input pulse P1 to the output nodes N2 of each of the plurality of flip-flops FF included in the first delay line part 20. This will be described in detail with reference to FIG. 9.

Respective fields in the table may indicate a buffer index number, a value of a first delay, a value of a second delay, and a sum value (ranking). At this time, the ranking may represent a ranking of all summed values. At this time, a buffer with a smallest sum value may have a first ranking, and a buffer with a highest sum value may have a last ranking. Or vice versa in another exemplary embodiment.

As described above in FIG. 7, the sum value may mean a time required for data to be transmitted from a node N1 where the input pulse P1 is output to any flip-flop (e.g., FF4).

A first delay which is a time required for an input value of any buffer to be transmitted to another buffer consecutive to the any buffer, and a second delay which is a time required for an output value of the any buffer to be transmitted to an input of a flip-flop connected to any buffer may occur.

At this time, a value obtained by adding the first delay value and the second delay value for each buffer may be referred to as data path delay.

Referring to FIGS. 7 and 9 together, when indexes of the respective buffer are listed in order, a ranking of the sum value of the first delay value and the second delay value may be different from a ranking of an index number of each buffer. For example, in the case of a third buffer, a buffer array ranking is 3rd, so the index number is '3', but the ranking of the sum value may be '5'. In detail, in order for data to be transmitted to a third flip-flop FF3, the data passes through the first buffer B1, the second buffer B2, and the third buffer B3. At this time, predetermined delays d1, d2, and d3 occur each time the data passes through the first buffer B1, the second buffer B2, and the third buffer B3, and a delay d13 may also occur until data output from the third buffer B3 is output as an output value of the third flip-flop FF3. That is, a delay until the data is transmitted from the output node N1 of the input pulse P1 to the output nodes N2 and N23 of the third flip-flop FF3 may be a value obtained by adding d1, d2, d3, and d13.

In this way, a delay (i.e., sum value) until data is transmitted to the output node of each flip-flop FF3 may be calculated.

For example, in the exemplary embodiment, the buffer index for the third flip-flop FF3 is 3 and the buffer index for the fourth flip-flop FF4 is 4. That is, the fourth flip-flop FF4 must pass through one more buffer than the third flip-flop FF3, but nevertheless, a delay sum value to the output node of the third flip-flop with the buffer index of 3 may be larger.

The code conversion part 30 may convert the order of the elements of the thermometer code O1 based on the calculated delay (sum value) (e.g., from the smallest sum value order).

The conversion code CO1 output by the code conversion part 30 may be provided to the priority encoder part 50.

The priory encoder part 50 may digitize a long thermometer code. For example, the priority encoder part 50 may convert a 5200-bit thermometer code into a 13-bit thermometer code. For example, if there are 5200 buffers (delay elements) B and flip-flops FF connected to the buffers described above in FIG. 7, a sequence of 5200 consecutive binary numbers is output, which may be expressed as a 13-bit binary number. That is, the priority encoder part 50 is an output value CO1 according to time of the code conversion part 30, and may express 5200-bit first thermometer code TC1 and second thermometer code TC2 as the 13-bit binary number.

Referring to FIG. 6, the first thermometer code TC1 may be a code output by the code conversion part 30 in relation to a rising edge of the input pulse P1 at a time point of a rising edge E4 of the clock pulse CK2 which is first generated after generation of the rising edge E1 of the input pulse P1 among the generated clock pulses CK. The first thermometer code TC1 expressed as 13 bits may be provided as the input of the operation part 60.

In addition, the second thermometer code TC2 may be a code output by the code conversion part 30 in relation to a falling edge E2 of the input pulse P1 at a time point of a rising edge E6 of the clock pulse CK4 which is first generated after generation of the falling edge E2 of the input pulse P1 among the generated clock pulses CK. The second thermometer code TC2 expressed as 13 bits may be provided as the input of the operation part 60.

At this time, a time interval of the first thermometer code TC1 and a time interval of the second thermometer code TC2 may be smaller than the period of the clock pulse CK.

Referring back to FIGS. 5 and 6, the clock pulse count part 40 may receive the input pulse P1 form the input signal generation part 10.

The clock pulse count part 40 may count the number of clocks pulses Ck generated during a maintenance period T of the input pulse P1. For example, since the number of rising edges of the clock pulse generated during a period in which the input pulse P1 is in an ON state is two like the edges E4 and E5, a counted value may be two like in FIG. 6.

An output value (coarse count) of the clock pulse count part 40, i.e., the counted value may be provided to the operation part 60.

Referring to FIGS. 5 and 6, the operation part 60 may determine a value the generation time difference by using the first thermometer code TC1, the second thermometer code TC2, and the countered number of clock pulses. For example, the generated time difference may be 2*Period+ TC1−TC2.

FIGS. 10A and 10B illustrate a plurality of delay line parts arranged in parallel according to an exemplary embodiment of the present invention.

As illustrated in FIG. 10A, two or more delay line parts 20 may be connected in parallel. At this time, the input pulse P1 output from the input signal generation part 10 may be input into each of the first delay line part 21, the second delay line part 22, the third delay line part 23, and the fourth delay line part 24. In addition, the first thermometer code O1, the second thermometer code O2, the third thermometer code O3, and the fourth thermometer code O4 output from the first delay line part 21, the second delay line part 22, the third delay line part 23, and the fourth delay line part 24 may be input into the code conversion part 30.

As illustrated in FIG. 10B, in another exemplary embodiment, it may be assumed that two delay line parts 20 are connected in parallel.

For example, the input pulse P1 output from the input signal generation part 10 may be provided along each of a first path path1 in which the output terminal of the input signal generation part 10 and the input terminal of the first delay line part 21 are connected to each other, and a second path path2 in which the output terminal of the input signal generation part 10 and the input terminal of the second delay line part 22 are connected to each other.

At this time, the time for the input pulse P1 output from the input signal generation part 10 to reach the input terminal of the first delay line part 21 and the input terminal of the second delay line part 22 may be different. This is because there is an input delay due to the difference in length between the first path path1 and the second path path2. In the exemplary embodiment of FIG. 10A, since the length of the first path path1 is shorter than the length of the second path path2, an input time interval of the input pulse path1 through the first path path1 is shorter than an input time interval of an input pulse path2 through the second path path2.

FIG. 11A illustrates configurations of the first delay line part and a second delay line part in FIG. 10B, and FIG. 11B illustrates an operation of a code conversion part when two delay line parts are used according to an exemplary embodiment of the present invention.

In FIG. 11A, for convenience of description, each delay line part is illustrated to include four buffers and four flip-flops.

In FIG. 11B, respective fields in the table indicate a delay line part number, a buffer index number, a value of a first delay, a value of a second delay, a first sum value (first ranking), and a first sum value (total ranking). At this time, the first raking may indicate the ranking of each sum value of the buffer indexes of the buffers in each delay line part. In addition, the total ranking may indicate the ranking of each sum value of buffer indexes of all buffers of the first delay line part and the second delay line part. At this time, in respect the first ranking and the total ranking, a buffer with a smallest sum value may have a first ranking, and a buffer with a highest sum value may have a last ranking. Or vice versa in another exemplary embodiment. The method of calculating the sum value may be the same as described in FIG. 5.

The code conversion part 30 may be configured to generate one conversion code by sorting and merging elements a first set (e.g., {(D1, 1), (D2, 2), (D3, 3), (D4, 4)}) in which pairs of sum values of elements of a thermometer code output by the first delay line part 21, and buffer indexes are listed in a descending order of the sum value, and elements of a second set (e.g., {(D5, 5), (D6, 6), (D7, 7), (D8, 8)} in which pairs of sum values of elements of a thermometer code output by the second delay line part 22, and buffer indexes are listed in the descending order of the sum value.

That is, each element of the first set and each element of the second set may be sorted based on the order of the lowest sum value.

For example, a buffer index reference output value in the first delay line part 21 may be {1, 2, 3, 4}, and a buffer index reference output value in the second delay line part 22 may be {5, 6, 7, 8}. In addition, a delay d1 and may be smaller than a delay d5 in the exemplary embodiments of FIGS. 10B and 11a. Accordingly, the sorted order may be (D1, 1), (D2, 2), (D5, 5), (D3, 3), (D6, 6), (D4, 4), (D7, 7), and (D8, 8). The output value of the flip-flop for each buffer index may be sorted according to the sorted order. For example, the sorted value (buffer index) may be 0(1), 0(2), 1(4), 1(6), 1(3), 1(5), 0(7), and 0(8).

As described above, when a plurality of delay line parts 20 are used, the input delay may be slightly different depending on the arrangement. FIG. 12 described below illustrates a delay according to arrangement when a plurality of delay line parts are used. FIG. 12 illustrates a graph of a delay according to whether to apply the code conversion part according to an exemplary embodiment of the present invention.

FIG. 13 is a diagram for describing an array reference of a flip-flop output values according to whether to apply the code conversion part and an increase value of the number of taps of FIG. 12 according to an exemplary embodiment of the present invention.

FIG. 12A illustrates a delay graph according to the number of taps in a state in which the code conversion part 30 is not applied, and FIG. 12B illustrates a delay graph according to the number of taps in a state in which the code conversion part 30 is applied.

Fields of the table in FIG. 13 include states before and after sorting, an arrangement reference of flip-flop output values, and an arrangement order of all delay sum values.

Hereinafter, the present invention will be described with reference to FIGS. 12 and 13 jointly.

Horizontal axes of graphs g1 and g2 indicate the numbers of taps. Referring to FIG. 11B, one tap may mean a pair of one buffer (delay element) (e.g. B1) and a flip-flop FF1 connected thereto. For example, when the total number of pairs of buffers and flip-flops connected thereto is 1000, the total number of taps may be 1000.

Vertical axes of the graphs g1 and g2 indicate a delay time ns. The delay time may mean a sum value of delays required for data to be transmitted to an output node of the flip-flop tapped to each buffer described above in FIG. 9.

Referring to FIGS. 11A to 13, the increase in number of taps in the graph g1 may mean, for example, an increase of the buffer index. For example, when the number of taps is 4 on the horizontal axis of the graph g1, this may mean buffer index 4. At this time, a delay value which is the vertical axis of the graph g1 may be D4 (=d1+d2+d3+d4+d14) as illustrated in FIG. 11B. For example, when the number of taps is 5, this may mean buffer index 5. At this time, a delay value which is the vertical axis of the graph g1 may be D5 (=d5+d15) as illustrated in FIG. 11B. At this time, referring to FIG. 13, D4>D5 may be established. Here, it can be seen that there may be also a case where a delay observed in the flip-flop of each tap does not increase as the index of the tap (e.g., index 4→index 5) increase, but locally decreases even though the index of the tap increases.

In contrast, the increase in number of taps in the graph g2 may mean not the increase of the buffer index, but an increase of a position according to the sorting order in a state in which output values of respective flip-flops are sorted by the code conversion part 30. For example, when the number of taps is 4 on the horizontal axis of the graph g2, a positional order of the sorted buffer indexes which is 1, 2, 5, and 3 may mean buffer index 3. In addition, in this case, the delay value which is the vertical axis of the graph g2 may be D3 (=d1+d2+d3+d13). For example, when the number of taps is 5 the positional order of the sorted buffer indexes which is 1, 2, 5, 3, and 6 may mean buffer index 6. In addition, in this case, the delay value may be D6 (=d5+d6+d16). At this time, referring to FIG. 13, D3<D6 may be established.

That is, when the code conversion part 30 of the present invention is not applied as illustrated in FIG. 12A, it can be seen that the graph g1 for delay as the number of taps increases does not have a monotonically increasing property. In contrast, when the code conversion part 30 of the present invention is applied as illustrated in FIG. 12B, it can be seen that the graph g2 for delay as the number of taps increases shows an increase phenomenon without decrease.

For example, unlike ASIC, which is an application specific integrated circuit, FPGA, which may be designed directly through programming, may change a function of a chip according to programming. Therefore, unlike the ASIC, the function of each component included in the FPGA may vary (or depending on the arrangement of the component), so the delay does not always increase but sometimes decreases whenever the number of taps increases, so the FPGA may not show the increase phenomenon without decrease.

However, as described, it can be confirmed through the graph g2 that the code conversion part 30 may correct the monotonically increasing property of the first delay line part 20.

As described above, when a plurality of delay line parts 20 are used, sorting of delays may be provided through the code conversion part. As a result, errors caused by jitter may be corrected and a TDC with high temporal resolution may be provided. For example, when four delay line parts are configured in parallel to have a total of 9600 taps, a TDC with a resolution of 0.8 ps per tap may be provided.

FIG. 14 is a block diagram illustrating a primary function unit of a PCB including an FPGA provided according to an exemplary embodiment of the present invention.

The receiver 200 in FIG. 3 may include an electronic device including a TDC 250 and a second control unit 270. At this time, the TDC 250 and/or the second control unit 270 may be implemented as the FPGA 1. In addition, the FPGA 1 may be mounted on a PCB 600 installed in the receiver 200.

The PCB 600 is a device capable of digital signal processing, and may include not only the FPGA 1 but also a data interface 601, a clock generation unit 603, a power supply unit 604, and other functional units not illustrated in FIG. 14.

The data interface 601 is a device that enables data exchange between the PCB 600 and the computing device 700, and may be implemented through USB, Ethernet, or UART, but is not limited thereto.

The clock generation unit 603 may provide a train of clock pulses counted by the FPGA 1.

A time difference value between two selected signals calculated by the FPGA 1 may be output from the FPGA 1 and provided to the data interface 601. The data interface 601 may provide the time difference between the two signals to the computing device 700.

The power supply unit 604 supplies power used in the PCB 600.

The computing device 700 may include a data interface 701, a CPU 702, and a memory 703. A binary file containing configuration data for programming the FPGA 1 may be recorded in the memory 703. The CPU 702 may transmit the binary file to the data interface 601 through the data interface 701.

The binary file may be stored in a ROM 80 of the FPGA 1 and used by the FPGA 1.

The configuration data may be such that the FPGA 1 configures a predetermined digital circuit therein.

The digital circuit may include a signal reception part 71 that receives the data signal Sd output from the first single-photon detector, a time difference determination part 72 configured to determine a time difference between a generation time of a reference pulse included in a predetermined reference timing signal Srt and a time-bin encoding pulse included in the data signal, a qubit state determination part 73 configured to determine a state of a time-bin qubit indicated by the time-bin encoding pulse by using the time difference, and a pulse train generation part 74 generating a pulse train having a period which is the same as a generation period of a qubit generated by the quantum cryptography key distribution system. Names of parts represented by reference numerals 71, 72, 73, and 74 are presented as above for convenience of description, but detailed names may be modified and presented as other names.

At this time, the reference timing signal may be the pulse train.

Further, the digital circuit may further include the input signal generation part 10, the first delay line part 21, the second delay line part 22, the code conversion part 30, the clock pulse count part 40, the priority encoder part 50, and the operation part 60.

In FIG. 14, the computing device 700 is illustrated as including the data interface 701, the CPU 702, and the memory 703, but as long as the binary file can be provided to the FPGA 1, the computing device 700 may also have a different configuration from presented in FIG. 14.

A name of a file including the configuration data for programming the FPGA 1 may have not the binary file but another name.

The ROM 80, the FPGA 1 including to the ROM 801, and the memory 703 may be all regarded as non-volatile recording media which may be read by the electronic device, which are provided according to an exemplary embodiment of the present invention, respectively.

For convenience of description, in FIGS. 2 to 4, an example of a coherent one way (COW) scheme is described in FIGS. 2 to 4. However, the present invention is not limited to the exemplary embodiment, and the present invention may be applied to QKD using time-bin encoding.

Various changes and modifications will be able to be easily executed without the scope without departing from fundamental characteristics of the present invention by those skilled in the art by using the exemplary embodiments of the present invention. Contents of each claim of the appended claims may be combined into other claims without a citation relationship within a scope which can be appreciated through this specification.

What is claimed is:

1. A receiving device of a quantum cryptography key distribution system, the receiving device comprising:
   a data line transmitting a state of a received quantum signal;
   a first single-photon detector connected to the data line; and
   a time-to-digital converter (TDC) receiving a predetermined reference timing signal and a data signal output by the first single-photon detector,
   wherein the TDC is configured to determine a time difference between a generation time of a reference pulse included in the reference timing signal, and a generation time of a time-bin encoding pulse included in the data signal, and configured to determine a state of a time-bin qubit indicated by the time-bin encoding pulse by using the time difference.

2. The receiving device of claim 1, further comprising:
   a second control unit configured to determine the state of the time-bin qubit indicated by the time-bin encoding pulse by using the time difference.

3. The receiving device of claim 1, wherein the reference timing signal is a pulse train having a period which is the same as the generation period of the qubit generated by the quantum cryptography key distribution system and or a pulse train signal synchronized with the generation period of the qubit.

4. The receiving device of claim 1, wherein the TDC includes
   a first delay line part receiving an input pulse having, as a width, a time difference between a first generation time point of the reference pulse, and a second generation time point of the time-bin encoding pulse generated after the first generation time point, and
   an operation part determining the generation time difference by using a thermometer code output by the first delay line part.

5. The receiving device of claim 4, wherein the TDC further includes a code conversion part converting and outputting an order of elements of the thermometer code,
   the operation part is configured to determine the generation time difference by using a conversion code output by the code conversion part,
   the conversion code is to sort an order of the elements of the thermometer code according to a predetermined reference, and
   the predetermined reference is a data path delay from an output node of the input pulse to an output node of each of a plurality of flip-flops included in the first delay line part.

6. The receiving device of claim 5, wherein the TDC further includes a second delay line part into which the input pulse is input,
   the code conversion part is configured to generate the conversion code by sorting and merging elements of a thermometer code output by the first delay line part and elements of a thermometer code output by the second delay line part according to a predetermine second reference, and
   the predetermined second reference is a data path delay from the output node of the input pulse to an output node of each of a plurality of flip-flops included in the first delay line part and the second delay line part.

7. The receiving device of claim 5, wherein the TDC is configured to use a clock signal having a period shorter than the generation period of the qubit generated by the quantum cryptography key distribution system, and
   the TDC further includes an input signal generation part generating the input pulse having, as the width, a time difference between a rising edge generation time point of the reference pulse and a rising edge generation time point of the time-bin encoding pulse, and
   a clock pulse count part counting the number of clock pulses of the clock signal, which are generated during a maintenance period of the input pulse, and
   the operation part is configured to determine a value of the generation time difference by using a first thermometer code output by the code conversion part at a rising edge time point of a first clock pulse among the generated clock pulses, a second thermometer code output by the code conversion part at a rising edge time point of a clock pulse generated immediately after a last clock pulse among the generated clock pulses, and the counted number of clock pulses.

8. The receiving device of claim 4, wherein the TDC is implemented by a Field Programmable Gate Array (FPGA), and the FPGA is programmed to include the first delay line part and the operation part.

9. The receiving device of claim 1, wherein the TDC is implemented by any one device of a Field Programmable Gate Array (FPGA), an Application Specific Integrated Circuit (ASIC), and an Integrated Circuit (IC), and the any one device is configured to determine the state of the time-bin qubit indicated by the time-bin encoding pulse by using the time difference.

10. The receiving device of claim 1, further comprising:
   a beam splitter receiving the quantum signal,
   wherein the data line is connected to the beam splitter.

11. An electronic device-readable non-volatile recording medium having a binary file including configuration data configured to program a Field Programmable Gate Array (FPGA), which is recorded therein so that an FPGA included in a quantum cryptography key distribution system to configure a digital circuit including
   a signal reception part receiving a data signal output by a first single-photon detector;

a time difference determination part configured to determine a time difference between a generation time of a reference pulse included in a predetermined reference timing signal, and a generation time of a time-bin encoding pulse included in the data signal; and a qubit state determination part configured to determine a state of a time-bin qubit indicated by the time-bin encoding pulse by using the time difference.

12. The electronic device-readable non-volatile recording medium of claim 11, wherein the digital circuit further includes a pulse train generation part generating a pulse train having a period which is the same as a generation period of a qubit generated by the quantum cryptography key distribution system, and the reference timing signal is the pulse train.

13. The electronic device-readable non-volatile recording medium of claim 11, wherein the digital circuit further includes a first delay line part receiving an input pulse having, as a width, a time difference between a first generation time point of the reference pulse, and a second generation time point of the time-bin encoding pulse generated after the first generation time point, and an operation part determining the generation time difference by using a thermometer code output by the first delay line part.

* * * * *